United States Patent [19]

Yamamoto et al.

[11] Patent Number: 4,879,632

[45] Date of Patent: Nov. 7, 1989

[54] COOLING SYSTEM FOR AN ELECTRONIC CIRCUIT DEVICE

[75] Inventors: Haruhiko Yamamoto, Yokohama; Masahiro Suzuki, Inagi; Yoshiaki Udagawa, Tokyo; Mitsuhiko Nakata, Kawasaki; Koji Katsuyama, Yokohama; Izumi Ono, Hachioji; Shunichi Kikuchi, Yokohama, all of Japan

[73] Assignee: Fujitsu Limited, Kawasaki, Japan

[21] Appl. No.: 914,942

[22] Filed: Oct. 3, 1986

[30] Foreign Application Priority Data

| Oct. 4, 1985 | [JP] | Japan | 60-221209 |
| Oct. 4, 1985 | [JP] | Japan | 60-152137 |
| Nov. 19, 1985 | [JP] | Japan | 60-259384 |
| Dec. 3, 1985 | [JP] | Japan | 60-273068 |
| Dec. 3, 1985 | [JP] | Japan | 60-273069 |
| Dec. 3, 1985 | [JP] | Japan | 60-273070 |
| Dec. 3, 1985 | [JP] | Japan | 60-273071 |
| Dec. 3, 1985 | [JP] | Japan | 60-273072 |
| Dec. 3, 1985 | [JP] | Japan | 60-273073 |
| Jan. 28, 1986 | [JP] | Japan | 61-017031 |

[51] Int. Cl.⁴ .................................... H05K 7/20
[52] U.S. Cl. .................... 361/386; 165/80.3; 165/185; 174/16.3; 357/81; 357/82; 361/382; 361/385
[58] Field of Search ............... 165/80.3, 185; 174/15 R, 16; 357/81, 82; 361/382, 385–389; 219/209, 210, 530, 540

[56] References Cited

U.S. PATENT DOCUMENTS

| 4,561,040 | 12/1985 | Eastman et al. | 361/385 |
| 4,688,147 | 8/1987 | Ono | 361/385 |
| 4,740,866 | 4/1988 | Kajiwara et al. | 165/80.4 |

FOREIGN PATENT DOCUMENTS

| 0079424 | 5/1983 | European Pat. Off. | 357/82 |
| 0151068 | 8/1985 | European Pat. Off. | 361/386 |
| 0196054 | 10/1986 | European Pat. Off. | 357/82 |

OTHER PUBLICATIONS

Follette, "All Purpose Chip Carrier", IBM Technical Disclosure Bulletin, vol. 20, No. 10, 3/78, pp. 4028-4029.

"Visualization of Flow", by Ji Young Cha et al., published in Japan on Jul., 1983, pp. 269-274.

Primary Examiner—Gregory D. Thompson
Attorney, Agent, or Firm—Staas & Halsey

[57] ABSTRACT

A cooling system includes a cooling module which has a heat transfer plate elastically biased and exposed to the flow of a coolant for transferring heat dissipated from a circuit component on a printed circuit board to the coolant, and a solder or low-melting-point metal for establishing thermal contact between the transfer plate and the circuit component.

36 Claims, 18 Drawing Sheets

Fig. 8
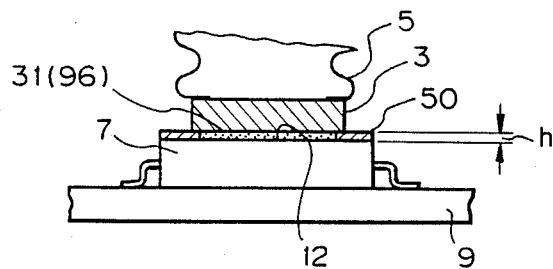
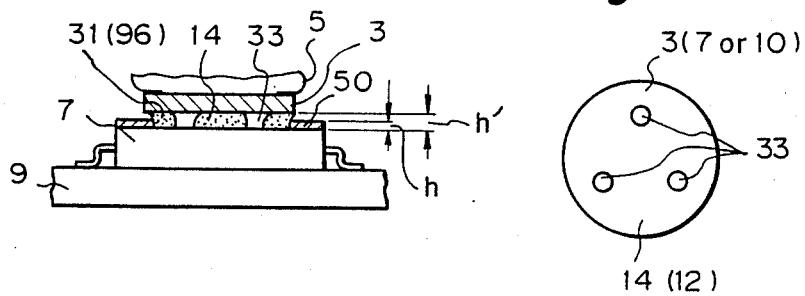
Fig. 9A        Fig. 9B
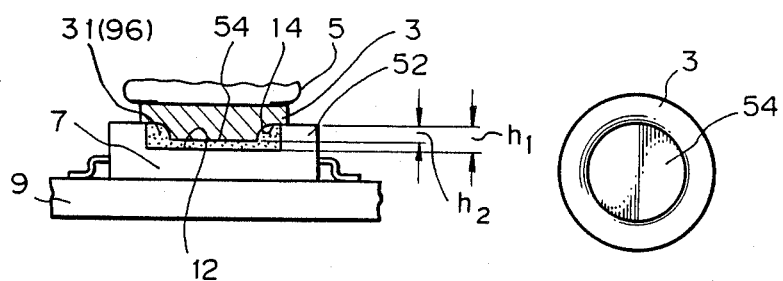
Fig. 10A       Fig. 10B Fig. 27
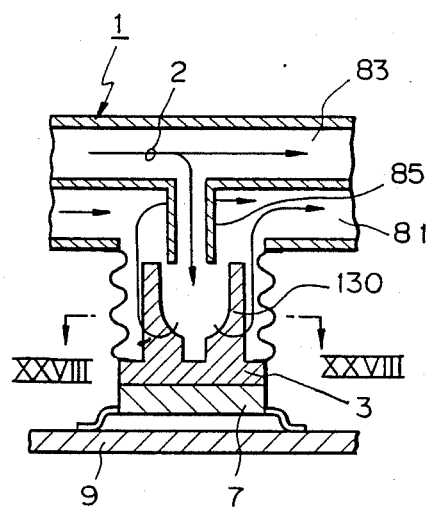
Fig. 28
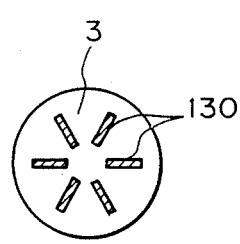
Fig. 29
Fig. 30
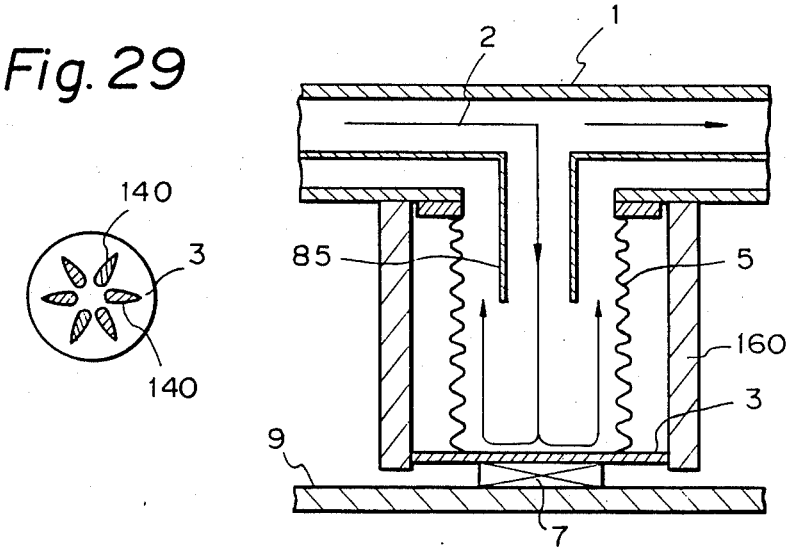

COOLING SYSTEM FOR AN ELECTRONIC CIRCUIT DEVICE

BACKGROUND OF THE INVENTION

1. Field of the Invention

The present invention relates to a cooling system for an electronic circuit device. More particularly, it relates to a printed circuit board holding electronic circuit components, such as semiconductors, large scale integrated circuits (LSI's), or integrated circuit (IC's), wherein these components are cooled by a cooling system that includes a cooling module or a series of cooling modules for removing the heat dissipated from the component and transferring it to a coolant flowing in a passage.

2. Description of the Related Art

In conventional cooling modules for electronic circuit devices, a heat transfer element such as a heat transfer plate or a heat sink head is pushed against the circuit components, such as IC's, LSI's, and semiconductors, by pressure from a spring or a bellows, to remove the heat dissipated from these circuit components. The heat transfer elements are exposed to a coolant (usually a gaseous coolant), in such a manner that the heat removed from the circuit components is transferred to the coolant by the corresponding heat transfer element.

Located between the heat transfer plate and the circuit component is a deformable or elastic thermal conductive sheet, such as a thermal sheet, and a second heat transfer plate can be located between the thermal sheet and the circuit component to be cooled. The thermal sheet usually consists of, for example, a silicone-containing material such as silicone rubber having incorporated therein a metal or metal oxide, such as alumina, beryllia to increase thermal conductivity and to bind the plastic material. The heat transfer between the first heat transfer plate and the corresponding circuit component is effected through the thermal sheet (and the second heat transfer plates, if any).

Since, however, the thermal sheet is made of a soft plastic material as a matrix material, although metal powders having a high heat conductivity are mixed therein, the heat conductivity is still relatively small. And it is generally not possible to increase the amount of the included metal component, as this will decrease the elasticity of the thermal sheet. Furthermore, since the thermal sheet is solid, although elastic, complete surface contact between the first heat transfer plate and the circuit component or between the first and second heat transfer plates can not be achieved if there is any unevenness or distortion in the contacting surfaces of the first or second heat transfer plate or the circuit component. Such incomplete surface contact results in large and non-uniform thermal transfer resistance, and any change in the pressure from the spring or bellows leads directly to a change in the thermal transfer resistance, resulting in unstable thermal transfer resistance. These factors decrease the heat transfer efficiency.

SUMMARY OF THE INVENTION

The primary object of the present invention is to eliminate the aforementioned drawbacks of the prior art by providing a cooling system for an electronic circuit device which can effectively, stably, and uniformly cool the circuit components.

To achieve the object mentioned above, according to the present invention, the thermal sheet is replaced by solder material which has flowability when heated, that is, the solder material is liquidized when heated above a predetermined temperature.

With this arrangement, the first heat transfer plate adheres directly to the circuit component or to the second heat transfer plate provided on the circuit component, in a compliant or rigid contact manner. That is to say, the flowable solder material spreads over the entire contacting surfaces between the first heat transfer plate and the circuit component or the second heat transfer plate, so that substantially complete surface contact therebetween is achieved regardless of any surface evenness of the contacting surfaces.

According to another aspect of the present invention, the thermal sheet is replaced with a low-melting-point metal which may be melted by the heat from the circuit component.

Means for preventing the molten metal from leaking from between the edges of the contacting surfaces of the first heat transfer plate and the circuit component or the second heat transfer plate may be provided.

Also, according to another aspect of the present invention, there is provided a means for increasing the contacting surface area between the first heat transfer plate and the circuit component or the second heat transfer plate.

According to still another aspect of the present invention, means are provided for producing means for producing a turbulence in the flow of the coolant to which the first heat transfer plate is exposed to increase the heat transfer efficiency.

BRIEF DESCRIPTION OF THE DRAWINGS

Other features, properties, and technical advantages of the present invention will become more apparent from the description given below with reference to the accompanying drawings, in which:

FIG. 8 is a partial sectional view of a cooling module according to another embodiment of the present invention;

FIG. 9A is a partial sectional view of a variant of the module of FIG. 8;

FIG. 9B is a bottom view of the first heat transfer plate of the module of FIG. 9A;

FIG. 10A is a view showing a modified variant of the module of FIG. 9A;

FIG. 10B is a bottom view of the first heat transfer plate of the module of FIG. 10A;

FIG. 27 is a cross sectional view of a cooling module according to a different embodiment of the invention;

FIG. 28 is a sectional view taken along the line XXVIII—XXVIII in FIG. 27;

FIG. 29 is a sectional view showing a variant of FIG. 28;

FIG. 30 is a cross sectional view of a cooling module according to a different aspect of the present invention;

DESCRIPTION OF THE PREFERRED EMBODIMENTS

Figure 1:
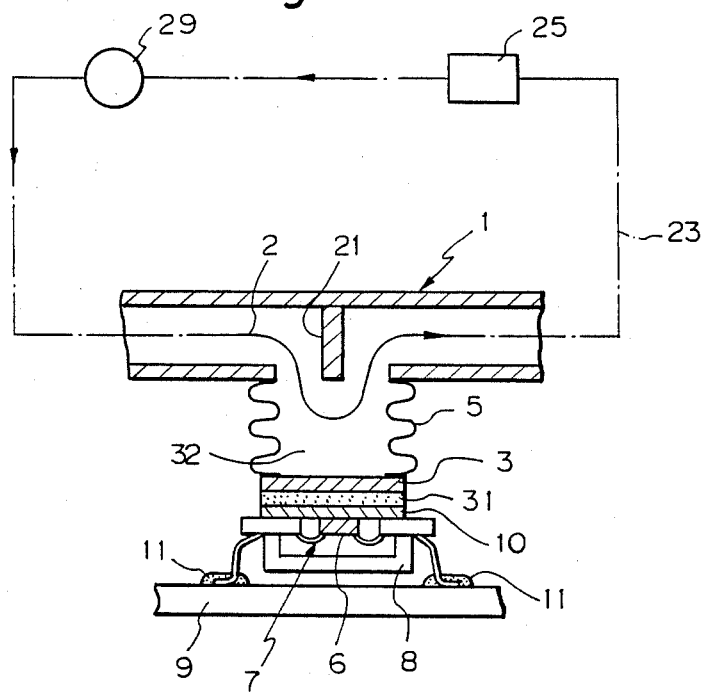
FIG. 1 is a schematic sectional view of a cooling system according to the present invention.

FIG. 1 shows an embodiment of the present invention in which the cooling module includes a conduit 1 providing means for passage of the coolant flow.

The coolant can be gas but is not limited thereto, and may be a liquid, such as water, liquid fluorocarbon, or even a liquid metal such as mercury or gallium. The conduit 1 is preferably a part of a recirculation system 23 which includes a pump 29 and a heat radiator or heat exchanger 25.

A first heat transfer plate 3 which is made of, for example, a heat conductive material, such as copper or brass, is connected to conduit 1 by means of a bellows 5 attached to conduit 1. The bellows 5 is usually made of a thin sheet of copper or stainless steel. Conduit 1 has therein, preferably, a deflector 21 extending toward the first heat transfer plate 3. A coolant recirculation zone 32 is defined in the bellows 5, in which zone 32 the first heat transfer plate 3 is exposed to the coolant at one side face of the plate 3.

The direction of the coolant flow in conduit 1 is changed by the deflector 21, which can be dispensed with, and thus the heat is removed from the first heat transfer plate 3 in the circulation zone 32.

The plate 3 is pressed against an electronic circuit component 7, such as an IC, LSI, or semiconductor provided on a printed circuit board 9, by means of the bellows 5 and the hydraulic pressure of the coolant.

The component 7 is bonded to the printed circuit board 9 by, for example, solder 11.

The component 7 illustrated in FIG. 1 has a tip 6 and a package 8.

In the illustrated embodiment of FIG. 1, a second heat transfer plate 10 is adhered to and on the component 7 by, for example, soldering or die bonding. The first heat transfer plate 3 forms a heat sink head.

The second heat transfer plate 10 has a larger area than tip 6, and thus the heat transfer surface thereof is relatively large.

According to the present invention, an intermediate layer of solder material 31 is provided between the first and the second heat transfer plates 3 and 10.

In the illustrated embodiment of FIG. 1, the intermediate layer of solder material 31 is secured to the bottom side face of the first heat transfer plate 3. Alternatively, the intermediate layer 31 can be secured to the circuit component 7 on the printed circuit board 9.

The solder layer 31 maintains its original sheet like shape at a normal temperature, i.e., when the circuit device, is not in operation. When the circuit device is operated and, consequently, the tip 6 produces heat, the solder material 31 is melted so that the first and the second heat transfer plates 3 and 10 are joined together by the solder material 31. Thus, the two plates 3 and 10 can be connected to each other in a substantially complete face-to-face contact fashion, regardless of any unevenness of the contacting surfaces of the two plates 3 and 10.

Thus, according to the present invention, the cooling efficiency of the cooling module is increased, because the solder material 31 ensures thermal connection between the first and the second heat transfer plates 3 and 10.

Preferably, the solder material 31 (referred to as the second solder hereinafter) has a low melting point T2 which is lower than the melting point T1 of the solder 11 (referred to as the first solder hereinafter). Namely T1 > T2.

Preferably the difference between the melting points T1 and T2 is in the range of 40° C. to 200° C. Namely, T1−T2=40° C.∼200° C.

Due to the difference between the melting points T1 and T2, the first solder 11 does not melt at the temperature at which the second solder 31 becomes molten. This means that when the cooling module is located in an atmosphere having, for example, a temperature at which the second solder 31 melts but the first solder 11 does not, the second solder 31 is melted in order to separate the first heat transfer plate 3 from the second heat transfer plate 10, but the connection between the circuit component 7 and the printed circuit board 9 is maintained as is by the first solder 11.

The removal or separation of the first heat transfer plate 3 from the second heat transfer plate 10 is necessitated when, for example, the tip 6 of the component 7 is replaced with another or modified in accordance with a design modification, or the tip 6 does not work and must be replaced or repaired.

The melting point of the second solder 31 can be decreased so as to be within the range of about 85° C. to about 100° C. by adding, for example, bismuth, to a conventional solder having tin and lead as the main components.

The first solder 11 can be a eutectic solder which has, for example, a melting point of about 185° C.

Figure 2:
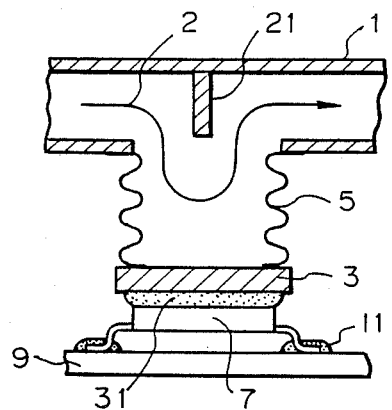
FIG. 2 is a schematic sectional view of a cooling system according to another embodiment of the present invention.

FIG. 2 shows a variant of FIG. 1. In the arrangement illustrated in FIG. 2, the second heat transfer plate 10 of FIG. 1 is omitted. Namely, the second solder 31 is allowed to achieve a direct thermal connection between the first heat transfer plate 3 and the circuit component 7.

The melting point T2 of the solder 31 is preferably within an operation range of the corresponding circuit component 7, that is, below a temperature at which the circuit component 7, especially the tip 6, might malfunction, so that when the device is located in an atmosphere having a relatively high temperature, so as to melt the solder 31 and separate the plate 3 from the component 7 as mentioned above, the circuit component 7 will not accidentally malfunction.

Apart from the absence of the second heat transfer plate, the embodiment shown in FIG. 2 functions in the same manner as the embodiment illustrated in FIG. 1.

As can be seen from the foregoing description, according to the present invention, when molten the second solder 31 ensures a full compliant contact between the two plates 3 and 10 (FIG. 1) or the first heat transfer plate 3 and the circuit component 7 (FIG. 2), even when the plate 3 and/or the circuit component 7 or the second heat transfer plate 10 have uneven or irregular contacting surfaces. The second solder 31 also contributes to easy separation of the first heat transfer plate 3 from the circuit component 7 or the second heat transfer plate 10.

The plates 3 and 10 can be made of a metal having a high solder wetting property.

Figure 3:
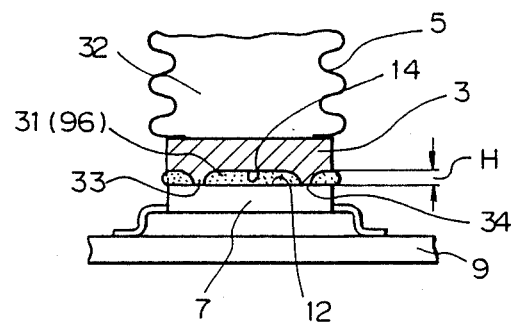
FIG. 3 is a schematic sectional partial view of a cooling system according to another embodiment of the present invention.

FIG. 3 shows a different embodiment of the invention, in which the first heat transfer plate 3 is provided with protrusions 33 on the bottom face 14 thereof, which protrusions 33 constitute projections for limiting downward movement of the first heat transfer plate 3 relative to the circuit component 7, so that the amount of the second solder 31 to be held between the plate 3 and the component 7 can be maintained constant.

These projections 33 limit the pressure of the first heat transfer plate 3 against the circuit component 7. Namely, when the protrusions 33 abut against the upper surface 12 of the circuit component 7 (or the second heat transfer plate 10 in FIG. 1), the first heat transfer plate 3 cannot move further downward even when pressure is exerted thereon by the spring force of the bellows 5.

Figure 3A:
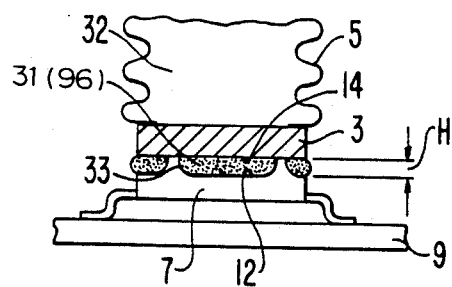
FIG. 3A is a view similar to FIG. 3, except illustrating an alternative embodiment.

The second solder 31, which is located on the circuit component 7 and is melted by the heat dissipated from the tip 6 of the component 7, is maintained between the first heat transfer plate 3 and the component 7 without leaking out from therebetween. The low melting second solder 31 tends to be squeezed from between the plate 3 and the component 7 in the outward direction when downward pressure is exerted on the plate 3 by the bellows 5. This tendency can be eliminated by the provision of the projections 33 between the bottom surface, i.e., the heat absorbing surface 14 of the plate 3, and the circuit component 7 or the second plate 10, if any. Alternatively, the protrusions 33 can be provided on the circuit component 7 or the second plate 10 instead of on the first plate 3, as illustrated in FIG. 3A. Note, that the height H of the projections 33 is determined in accordance with the necessary amount of the second solder 31.

Preferably, the protrusions 33 have flat bottom surfaces 34 to realize a stable contact of the protrusions 33 with the upper surface 12, i.e. the heat conduction surface, of the component 7.

Three protrusions 33 are illustrated in this embodiment (see FIG. 9B) but the number thereof is not limited. Preferably, the three protrusions 33 are arranged at an equicircumferential distance in the form of, for example, a tripod, to ensure stable location of the plate 3 on the component 7 or the plate 10.

It should be noted here that the projections, which are embodied, for example, by the protrusions 33, also contribute to an increase in the contact pressure of the second solder 31 against the circuit component 7 when the plate 3 moves downward, and accordingly, to cause the second solder 31 to begin melting from the center thereof. The second solder 31 is maintained between the plate 3 and the component 7 not only by the protrusions 33 but also by its own interfacial tension.

Figure 4:
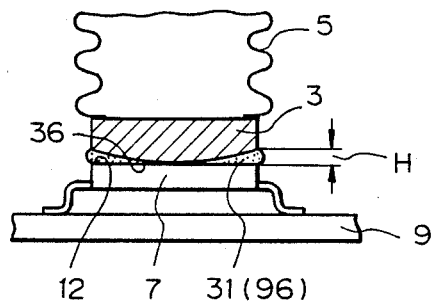
FIG. 4 is a view similar to FIG. 3 but showing a variant thereof.
Figure 4A:
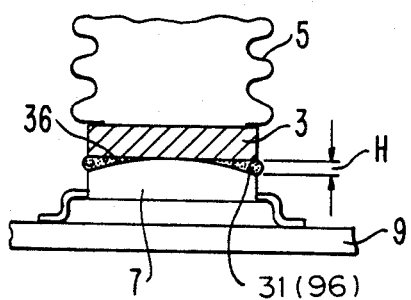
FIG. 4A illustrates an alternative to the FIG. 4 embodiment.

In a variant shown in FIG. 4, the protrusions 33 shown in FIG. 3 are replaced by a semi-spherically curved bottom surface 36 which is convexed toward the heat radiation surface 12 of the component 7. The height H of the crown, i.e. the convex of the surface 36, is the same as the height H of the protrusions 33 in FIG. 3. The curved surface 36 can be provided on the component 7 (or the plate 10 in FIG. 1) in place of the plate 3, as illustrated in FIG. 4A.

In the embodiment illustrated in FIG. 4, the second solder 31 can be maintained between the first plate 3 and the component 7 around the top of the crown formed by the curved surface 36, due to its own interfacial surface tension.

The second solder 31 may contain or produce air bubbles therein, and accordingly, when the second solder 31 is melted by the heat, the bubbles will be maintained in the second solder 31. These bubbles decrease the efficiency of the heat transmission between the first heat transfer plate 3 and the circut component 7.

Figure 5A:
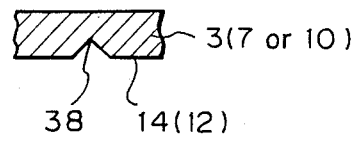
FIGS. 5A and 5B are respectively a partial cross sectional view and a plan view of a first embodiment of a contacting surface of a first heat transfer plate in accordance with the present invention.
Figure 5B:
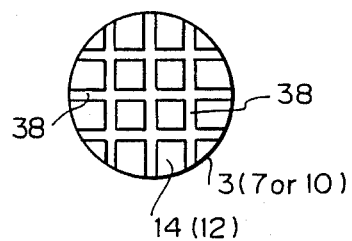
Figure 6A:
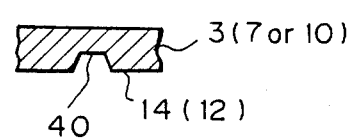
FIGS. 6A and 6B are views similar to FIGS. 5A and 5B, respectively, but showing a second embodiment of a contacting surface for a first heat transfer plate in accordance with the present invention.
Figure 6B:
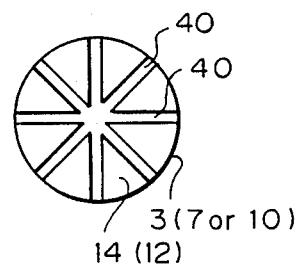
Figure 7:
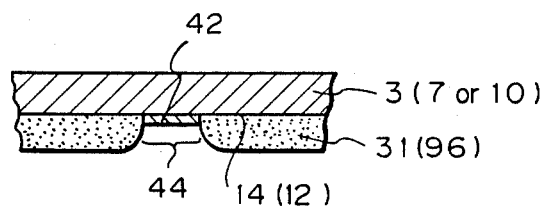
FIG. 7 is a partial cross sectional view of another embodiment of a contacting surface of a first heat transfer plate according to a modified embodiment of the present invention.

According to one aspect of the present invention, as shown in FIGS. 5A, 5B, 6A, 6B and 7, means for discharging the air bubbles from the second solder 31 is provided. In FIGS. 5A and 5B, the first heat transfer plate 3 has, on the bottom surface 14 thereof, recessed grooves 38 which are arranged in a grid-like manner and which have a generally V-shaped cross section. The grooves 38 provide a passage for discharging the air bubbles in the second solder 31. The gas discharging passage can be also formed by a plurality of radially extending recessed grooves 40 as shown in FIGS. 6A and 6B.

The grooves 40 have a generally trapezoidal cross section.

The cross sectional configuration of the recessed grooves 38 is not limited to the shapes illustrated in FIGS. 5A and 6A, but can be of any other shape. Also, the arrangement of the recessed grooves 38 or 40 is not limited to the grid-like or radial arrangements shown in FIGS. 5B or 6A.

The recessed grooves 38 or 40 can be machined or cut by a mechanical cutter or cutting machine (not shown), or they can be made, for example, using optical means, such as a laser cutter. Alternatively, it is also possible to provide recessed grooves 44 (FIG. 7) by means of a solder resist 42 which is formed in a predetermined pattern on the bottom surface 14, so that when the second solder 31 is formed on the surface 14 of the first plate 3, the solder is prevented from forming in the predetermined pattern of the solder resist 42. With the arrangement shown in FIG. 7, predetermined recessed grooves 44 are thus automatically formed when the second solder 31 is formed between the first heat transfer plate 3 and the circuit component 7 or the second heat transfer plate 10, if any. The air bubbles which would otherwise remain in the second solder 31 can be thus discharged to the outside through the recessed grooves 38, 40, or 44.

Figure 7A:
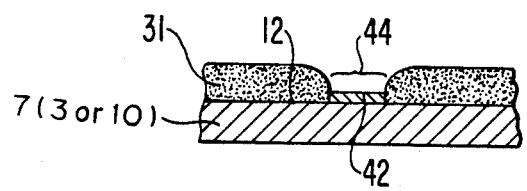
FIG. 7A is a view similar to FIG. 7, but illustrating an alternative embodiment.

As illustrated in FIG. 7A, gas discharging passages can be provided on the circuit component 7 or on the second heat transfer plate 10, if any, instead of on the first heat transfer plate 3. In this alternative, the recessed grooves 38, 40, or 44 can be formed on the upper surface of the heat transfer plate 10 or circuit component 7 adjacent to the second solder 31.

Since the gap between the plate 3 and the component 7 or the plate 10 is very small, the second solder 31 can be at least partially maintained between the plate 3 and the component 7 or the plate 10 because of the interfacial tension thereof, as mentioned above. Nevertheless, the second solder 31 when molten tends to flow, or to be squeezed from between the plate 3 and the component 7 or the plate 10, if any, due to its flowability, particularly when downward pressure is exerted on the second solder 31 by the bellows 5 through the plate 3.

To prevent the second solder 31 from leaking out or being squeezed out, according to another aspect of the present invention, means for maintaining the second solder 31 between the plate 3 and the plate 10 or the component 7 is provided.

The means for preventing the second solder 31 from flowing out and for maintaining the second solder 31 between the plate 3 and the component 7 or the plate 10, if any, is shown in FIGS. 8, 9A, 9B, 10A, 10B, and 11.

In an arrangement shown in FIG. 8, the component 7 has an annular circumferential wall 50 on the upper surface 12. The wall 50 is made of material which has no solder wetting property, such as a slder resist, so that the second solder 31 does not adhere to the wall 50.

The wall 50 has a height h which is determined in accordance with the necessary amount of second solder 31 enclosed within the wall 50. The plate 3 comes into contact with the wall 50 to define a closed space for the second solder 31 between the plate 3 and the component 7 or the plate 10, if any. The wall 50 prevents the second solder 31 from leaking out therefrom or from being squeezed out therefrom. If the second solder 31 leaks out onto the circuit plate 9, short-circuits or malfunctions of the circuit components or wiring on the plate 9 may occur.

These problems can be solved by the provision of the circumferential wall 50.

In an arrangement shown in FIGS. 9A and 9B, the protrusions 33, which are similar to those shown in FIG. 3, are provided on the bottom surface 14 of the plate 3, in addition to the circumferential wall 50 of the component 7. The height h' of the protrusions 33 is higher than the height h of the wall 50. The protrusions 33 limit the downward movement of the plate 3. Namely, the protrusions 33 can provide a precise gap between the plate 3 and the component 7 or the plate 10, if any.

Since the difference between the heights h and h' is very small, the solder 31 can be maintained between the plate 3 and the component 7 or the plate 10 due to interfacial tension. It is also possible to provide the protrusions 33 on the component 7 or the plate 10, if any, instead of on the plate 3.

In a variant of the invention as shown in FIGS. 10A and 10B, the protrusions 33 in FIG. 9A are replaced with a single large projection 54 having a generally trapezoidal cross section and provided on the plate 3. The projection 54 has a height h2 which is smaller than a height h1 of the circumferential wall 52 provided on the component 7 or the plate 10, if any. The wall 52 comes into contact with the bottom surface 14 of the plate 3, so that there is a small gap between the bottom of the projection 54 and the upper surface 12 of the component 7, which gap can be filled with the second solder 31. Since the projection 54 is completely embedded in the second solder 31, a better thermal contact between the plate 3 and the component 7 can be realized. In the arrangement shown in FIG. 10A, a completely enclosed space is provided within the wall 52 when the wall 52 comes into contact with the plate 3, so that the second solder 31 can be completely enclosed in the enclosing space. The heights h1 and h2 can be determined in accordance with the necessary amount of second solder 31 to be enclosed in the enclosed space.

Figure 11:
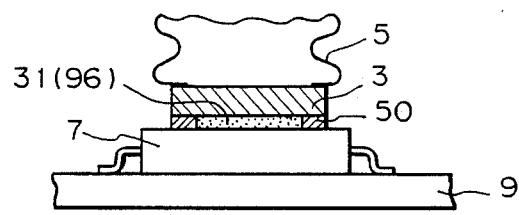
FIG. 11 is a partial sectional view of another embodiment of a cooling module of the present invention.

In an embodiment illustrated in FIG. 11, the circumferential wall 50 is provided on the plate 3, instead of on the component 7.

The arrangement shown in FIG. 11 functions in the same manner as the embodiment shown in FIG. 8.

As mentioned hereinbefore, the separation of the first heat transfer plate 3 from the component 7 or the second heat transfer plate 10, if any, or the disassembly of the cooling module is sometimes necessary for, for example, design modification or repair, etc. Accordingly, an easy separation of the first heat transfer plate 3 from the component 7 or the second plate 10 is desirable.

The separation is effected when the second solder 31 is in a molten state.

To melt the second solder 31 when the circuit component 7 is not in operation, it is possible to heat the second solder 31 by, for example, locating the cooling module in a high temperature atmosphere or by using soldering irons (not shown). However, according to one aspect of the present invention, to realize an easier separation of the plate 3, a hot liquid 60 is circulated in the conduit 1 and the recirculation line 23 (see also FIG. 1). Namely, when it is necessary to melt the second solder 31 in order to separate the plate 3 from the component 7 or the plate 10, if any, a hot liquid, such as hot water, is circulated in the recirculation system 23. The plate 3 is heated by the hot liquid 60, so that the second solder 31 can be melted.

When the second solder 31 has a low-melting-point, it can be melted at a temperature below 100° C., as mentioned above.

The melting point of the second solder 31 depends on the amount of the additive, such as bismuth, to be added to the solder, which is usually made of tin and lead, as mentioned before. Boiling water can be used as the hot liquid or a hot gas can be used instead.

Figure 12:
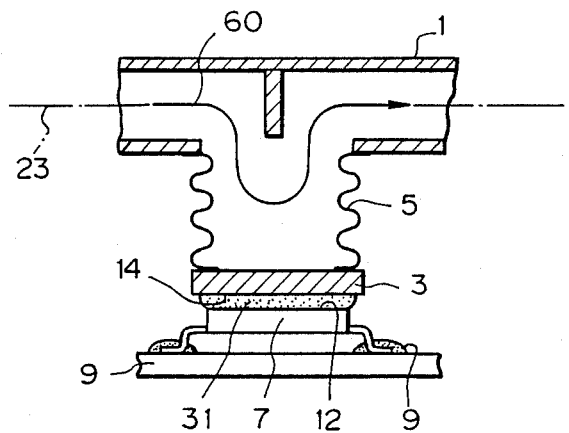
FIG. 12 is a partial cross sectional view of still another embodiment of the device of the present invention.

The arrangement shown in FIG. 12 is most preferable, since any modification of the design of the construction thereof would have little if any beneficial effect.

Figure 13:
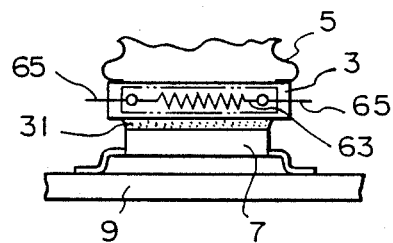
FIG. 13 is a partial view showing a variant of the device of FIG. 12.

Alternatively, it is possible to incorporate a heater in the first plate 3, as shown in FIG. 13. In FIG. 13, the plate 3 is hollow and is provided with a heater 63 therein.

The heater 63 can be a conventional electric heater. Preferably, two terminals 65 extend outside from the plate 3, so that these terminals 65 can be easily connected to a power source (not shown) only when necessary. In the embodiment shown in FIG. 13, when the second solder 31 is melted by the heater 63, the heating is preferably effected after the coolant 2 is removed from the conduit 1, and accordingly, from the recirculation system 23.

With the arrangement shown in FIG. 12 and 13, the solder 31 can be melted through the plate 3 by a simple heating process.

Figure 14:
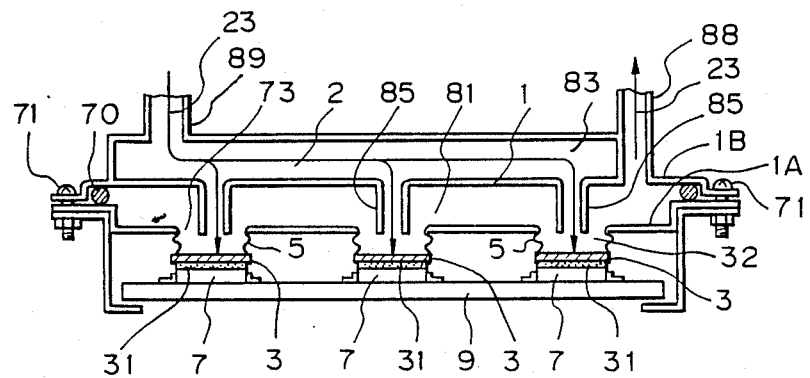
FIG. 14 is a schematic sectional view of apparatus which includes a series of cooling modules according to the present invention.

FIG. 14 shows a series of cooling modules (three modules in the illustrated embodiment), in which each module corresponds generally in shape and function to the cooling module shown in FIG. 2. The conduit 1 is constructed to present a lower half 1A and an upper half 1B. The lower half 1A has, for example, a generally U-shaped cross section, and has openings 73 connected to the recirculation zones 32 of the cooling modules. The upper half 1B can be fitted onto the lower half 1A to define an outlet passage 81.

The upper half 1B, therefore, acts as a cover for passageway for the coolant 2. The upper half 1B has an upper inlet plenum or passage 83 which corresponds to the conduit 1 in FIG. 2. The passageway 83 is connected to the outlet plenum or passageway 81 by nozzles 85, so that the coolant 2 fed through the recirculation system 23 can be fed or ejected onto the heat transfer plates 3 of the cooling modules through the nozzles 85 and is recirculated to the recirculation system 23 through an outlet passageway 81 and an outlet pipe 88 provided on the upper half 1B of the conduit 1. The coolant 2 can be introduced into the inlet passageway 83 from an inlet pipe 89 provided on the upper half 1B.

The upper half 1B can be detachably connected to the lower half by, for example, bolts 71.

The reference numeral 70 designates a seal, such as a ring packing, or a gasket which is located between the upper and lower halves 1A and 1B to seal the connection therebetween.

Figure 17:
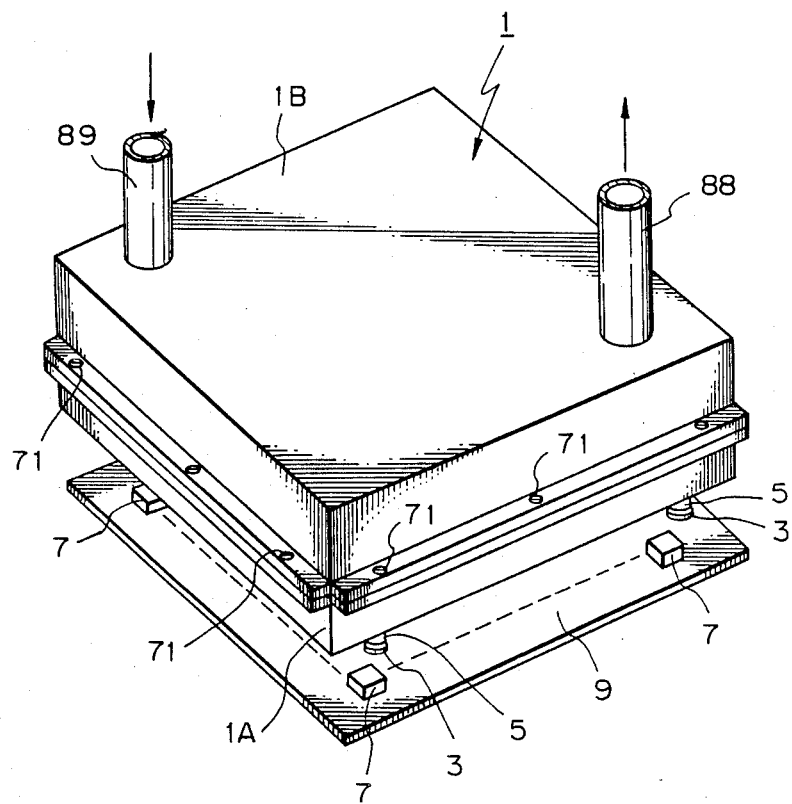
FIG. 17 is a perspective view of a cooling unit comprising a series of cooling modules as shown in FIG. 14.

FIG. 17 is an exploded perspective view of the exterior of a cooling unit having a series of cooling modules of the sort shown in FIG. 14. In FIG. 17, the inlet pipe 89 and the outlet pipe 88 are in different positions from those shown in FIG. 14. Also in FIG. 17, since the board 9 is shown in a displaced position, the firs heat transfer plates 3 are also show as being separated from the corresponding circuit components 7 on the printed circuit board 9. The second solder 31 (not shown) is held, for example, on the corresponding components 7 with the help of the circumferential wall 50 (FIG. 8). The cover 1B can be detached from the lower half 1A by removing the bolts 71.

Figure 15:
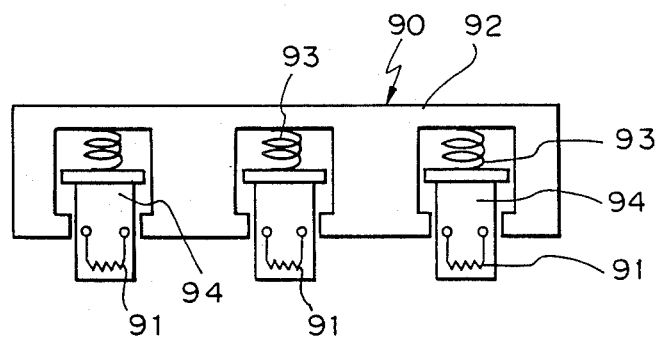
FIG. 15 is a schematic view of a heater unit according to the present invention.
Figure 16:
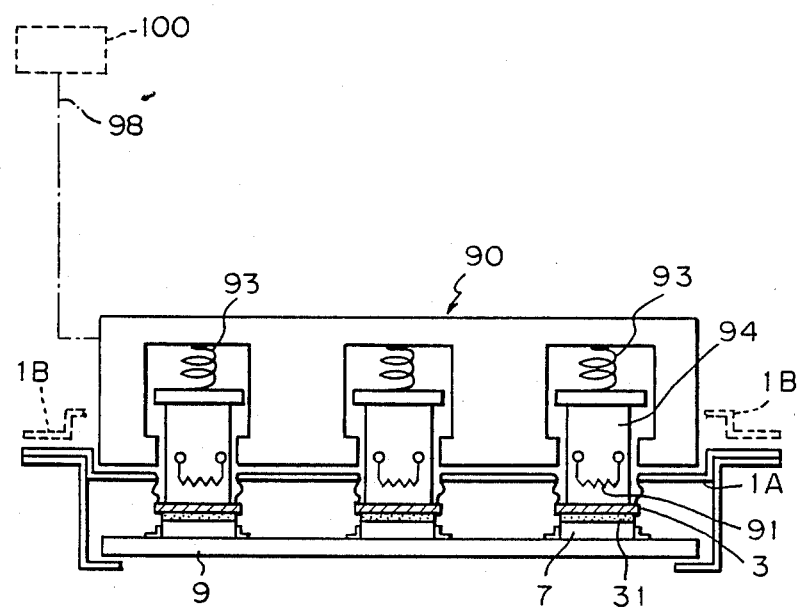
FIG. 16 is a schematic view of apparatus which includes a series of cooling modules and which has a heater unit as illustrated in FIG. 15.

FIG. 15 shows a heater unit 90 having a heater block 92 provided with a number of heaters 91 corresponding to the number of cooling modules. The heaters 91 are supported in heater supports 94 which, in turn, are supported in the heater block 92 by springs 93. The heater supports 94 can move up and down. The heaters 91 can be conventional electrical heaters similar to the heater 63 shown in FIG. 13. The heater unit 90 can be located on the cooling modules, after the cover 1B of the passage 1 is removed, as shown in FIG. 16. When the heater unit 90 is located on the cooling modules, the heater supports 94, and accordingly the heaters 91, are pressed against the plates 3 of the corresponding cooling module by the springs 93.

Consequently, when the heaters 91 are energized with an electrical power supply (not shown) the second solder 31 is heated through the plates 3 by the heaters 91, so that the second solder 31 becomes molten.

The heating by the heaters 91 can be controlled by a controller 100 electrically connected to the heater unit 90, so that it is possible to heat only one or several of the cooling modules in which the second solder 31 must be melted. It is also possible to heat all the cooling modules at one time.

The springs 93 can be dispensed with, since the heater supports 94 are pressed against the plates 3 by the dead weight thereof.

With the arrangement illustrated in FIG. 16, the melting of the second solder 31 of the cooling modules can be easily carried out simply by replacing the cover 1B of the conduit 1 for the coolant with the heater unit 90.

Figure 18:
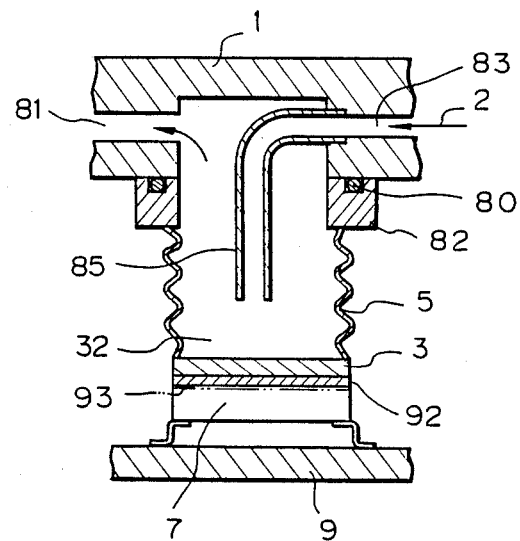
FIG. 18 is a partial sectional view of a cooling module according to a different embodiment of the present invention.

FIG. 18 shows a cooling module according to another aspect of the present invention, in which the first heat transfer plate 3 is thermally connected to the circuit component 7 by a metal plate 92 having a high thermal conductivity. Namely, the second solder 31 shown in the preceding drawings is replaced with the conductive metal plate 92 in FIG. 18.

The metal plate 92 can be connected to the first heat transfer plate 3 by an adhesive or a mechanical fastening means (not shown).

Figure 19:
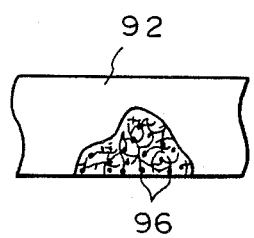
FIG. 19 is an enlarged partial sectional view of the metal plate which forms a part of the module shown in FIG. 18.

The metal plate 92 has a number of small cells or cavities, i.e. it is porous, as shown in FIG. 19. The metal plate 92 contains a low-melting-point metal 96 (FIG. 19) impregnated therein. The porous metal plate 92 can be made by compressing a foamed metal or metal mesh. The low-melting-point metal 96 is made, for example, of an alloy or alloys of two or more of gallium (Ga), indium (In), and tin (Sn), and the like, which can be melted at a temperature of, for example, from about 40° to about 120° C. Namely, the low-melting-point metal 96 is preferably solid in the normal state, i.e., without heating, and is molten when heated to a temperature higher than, for example, 40° C.

Note that the metals, Ga, In, Sn can be easily oxidized in the atmosphere and, accordingly, are preferably used in an environment not containing oxygen.

The low-melting-point metal 96 is impregnated in the small cells or cavities of the porous metal plate 92.

When the metal plate 92 is heated by the heat from the circuit component 7, the low-melting-point metal 96 impregnated in the metal plate 92 is melted and liquidized, so that the low-melting-point metal 96 comes into compliant contact with the circuit component 7 or the second plate 10, if any, resulting in complete thermal contact between the first plate 3 and the component 7 or second plate 10 through the metal plate 92.

Thus, highly efficient heat transmission can take place from the circuit component to the coolant 2.

It should be noted that the liquidized low-melting-point metal 96 can be maintained between the plate 3 and the component 7 or the second plate 10, if any, without leaking out from therebetween, due to the interfacial tension thereof.

Since the low-melting-point metal 96 is completely contained in the metal plate 92 when it is not heated, the separation of the first plate from the component 7 or the second plate 10, if any, can be easily carried out when the cooling module is not operating, namely, when the circuit device is not operative.

In the arrangement shown in FIG. 18, the coolant 2 can be ejected onto the first heat transfer plate 3 through the nozzle 85, similar to the aspect shown in FIG. 14. The bellows 5 can be secured to the conduit 1 by a flange 82 connected to the bellow 5 through an O-ring 80, which seals the connection between the flange 82 and the conduit 1.

Alternatively, it is also possible to use a low-melting-point metal 96 which is impregnated in the metal plate 92 and which is liquid in the normal state, i.e., without heating. In this alternative, the low-melting-point metal 96 has a melting point below or within the environmental temperature range in which the cooling module and the circuit device are operated.

If such a low-melting-point metal, which is liquid even at the environmental temperature, is impregnated in the metal plate 92, the latter can be cooled below the melting point of the low-melting-point metal 96 to solidify the metal 96 when the first plate 3 is separated from the component 7 or the second plate 10, if any. Namely, since it is necessary to solidify the low-melting-point metal 96 to separate the heat transfer plate 3 from the component 7, the low-melting-point metal 96 must be cooled to a temperature at which the low-melting-point metal 96 is a solid.

It is also possible to locate the metal plate 92 containing the low-melting-point metal 96 contained therein on the component 7 or the plate 10, if any, without being secured to the first plate 3.

Figure 20:
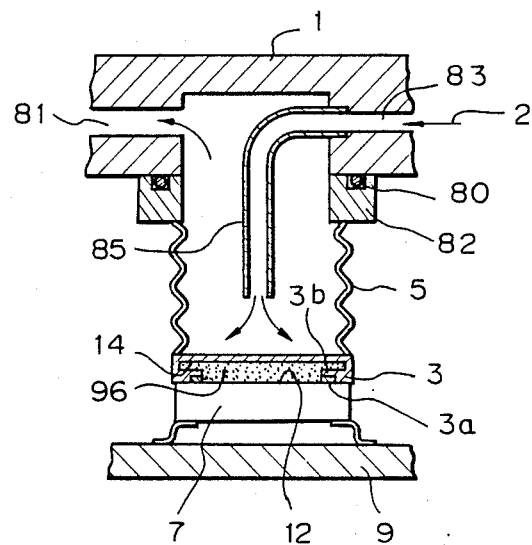
FIG. 20 is a partial sectional view of a variant of FIG. 18.

In a modified arrangement shown in FIG. 20, the low-melting-point metal 96 is directly held in and by the first heat transfer plate 3. The bottom surface 14 of the plate 3 is provided with a circumferential wall or flange 3a which comes into contact with the component 7.

The flange 3a has an annular projection 3b extending inward to provide a generally T-shaped space in the plate 3, so that the low-melting-point metal 96 can be held in and by the plate 3 even when the plate 3 is separated from the component 7, so long as the metal 96 is in a solid state.

It should be noted that, when the plate 3 is separated from the component 7, the low-melting-point metal 96 should be solid.

Between the flange 3b and the upper surface 12 of the component 7 is provided a seal member 103, such as an O-ring, gasket or packing to prevent the liquidized low-melting-point metal 96 from leading out from the connection between the component 7 and the wall 3a of the plate 3. The seal member 103 can be secured to the flange 3b and/or the wall 3a of the plate 3.

In the arrangement shown in FIG. 20, when the low-melting-point metal 96 is heated by the heat from the component 7, the metal is melted to provide a compliant contact between the component 7 and the now liquidized metal 96, so that a complete thermal contact between the plate 3 and the component 7 can be established through the low-melting-point metal 96 which has been melted by the heat of the component 7. Also, the plate 3 can be easily separated from the component 7 merely by cooling the low-melting-point metal 96 to a temperature below the melting point thereof, to solidify it.

As is obvious from the above, if the low-melting-point metal 96 is solid in the normal ste when the cooling module and the circuit device are not operating, cooling of the low-melting-point metal 96 is not necessary when the plate 3 is separated from the component 7.

Figure 21:
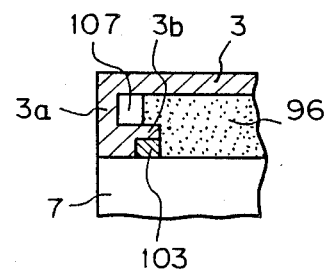
FIG. 21 is an enlarged view illustrating a modification of a part of the module of FIG. 20.

The low-melting-point metal 96 expands in volume when heated by the heat from the component 7, that is, when it is liquidized, and preferably a means is provided for absorbing this expansion. To this end, according to an embodiment of the present invention, a cavity or space 107 is provided between the low-melting-point metal 96 and the wall 3a of the plate 3, as shown in FIG. 21. The space 107 can absorb the expansion of the low-melting-point metal 96. Namely, when heated, the low-melting-point metal 96 can expand into the space 107.

Figure 22:
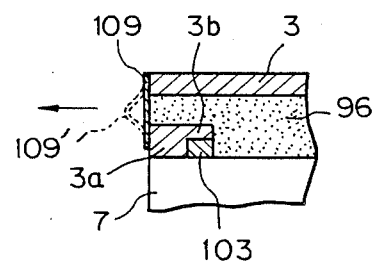
FIG. 22 is a view similar to FIG. 21 but showing a variant thereof.

In an embodiment shown in FIG. 22, a part or all of the side peripheral portion of the wall 3a is formed by an elastic sheet or sheets 109 connected thereto, which can deform outward in the direction designated by an arrow, substantially perpendicular to the direction of the spring force of the bellows 5, as shown by an imaginary line in FIG. 22. The deformation of the sheet(s) 109, as shown at 109′ absorbs the expansion of the low-melting-point metal 96.

Figure 23:
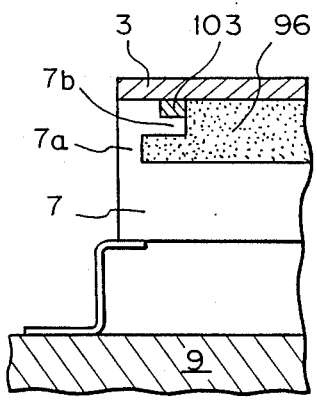
FIG. 23 is an enlarged partial view similar to FIG. 20, but showing a modified embodiment.

It is also possible to provide a circumferential wall 7a having a flange 7b on the component 7 instead of on the plate 3, as shown in FIG. 23. In the embodiment shown in FIG. 23, the seal member 103 is provided between the plate 3 and the flange 7b of the component 7. In FIG. 23, the low-melting-point metal 96 can be held in the circumferential wall 7a and on the component 7. The concepts shown in FIGS. 21 and 22 can be, of course, incorporated in the embodiment illustrated in FIG. 23.

Furthermore, the embodiments shown in FIGS. 3, 4, 5B, 6B, 7, 8, 9A, 10A, and 11 can be combined with the embodiment shown in FIG. 18 or 20, in which the second solder 31 is replaced with the low-melting-point metal 96. This alternative is designated in those drawings by a parenthesized numeral (96) after the numeral 31.

In the embodiments shown in FIGS. 18, 20, 21, and 22 the upper surface 12 of the component 7 (or the upper surface of the second plate 10, if any) can be coated with, for example, fluorinated plastic resin 93 (FIG. 18), such as Teflon®, so that the low-melting-point metal 96 can be easily separated from the coated surface 12 when the low-melting-point metal 96 is solidified to separate the plate 3 from the component 7. In the embodiment shown in FIG. 23, the bottom surface 14 of the plate 3 can be coated with a similar material for the same purpose.

To increase the cooling effect, according to another aspect of the present invention, a means for increasing the contacting surface area between the coolant 2 and the first heat transfer plate 3 is provided, as shown in FIGS. 24 to 30.

Figure 24:
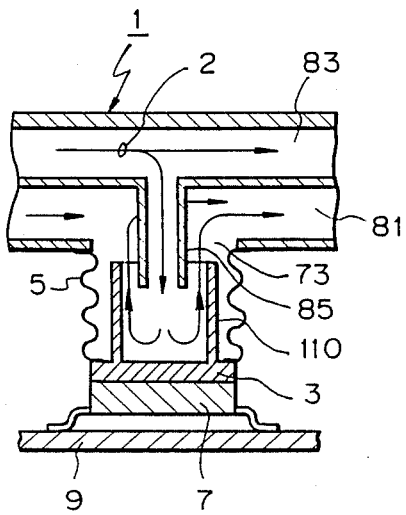
FIG. 24 is a cross sectional view of a cooling module according to another aspect of the invention.

In FIG. 24, the plate 3 is provided with a substantially cylindrical tubular plate 110 integral therewith into which the lower end, i.e., the front end, of the nozzle 85 is inserted.

Figure 25:
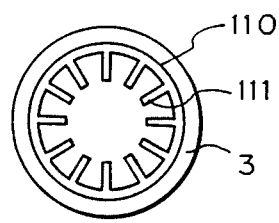
FIG. 25 is a plane view showing a variant of a tubular plate.

The tubular plate 110 is located in the bellows 5. The tubular plate 110 increases the contacting surface area between the plate 3 and the coolant 2. The coolant ejected from the nozzle 85 comes into collision with the plate 3 and flows up along the tubular wall of the plate 110, removing the heat from the plate 3, as shown by arrows in FIG. 24. The tubular plate 110 can be provided, on its inner periphery, with heat radiation fins 111, as shown in FIG. 25. As is well known, such fins 111 will increase the heat transmission efficiency between the tubular plate 110 and the coolant 2. The fins 111 are preferably arranged in a concentrical arrangement as shown in FIG. 25, so that the radially extending fins 111 do not substantially interrupt the smooth flow of the coolant 2.

Figure 26:
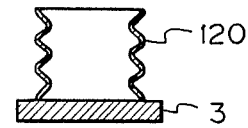
FIG. 26 is a sectional view of still another modification of a tubular plate.

In a variant shown in FIG. 26, the tubular plate 110 in FIGS. 24 is replaced with a cylindrical tubular plate 120 having a corrugated cylindrical wall. With the variant shown in FIG. 26, the heat transmission effect can be increased in comparison with the plain cylindrical wall as shown in FIG. 24.

Since the coolant 2 substantially does not come into direct contact with the bellows 5, because of the presence of the tubular wall or the tubular plate 110 or 120, which has a height substantially equal to the length of the bellows 5, the bellows, which is usually made of a thin metal plate, can be protected from collision of the coolant 2 thereagainst, resulting in the prevention of possible corrosion of or damage to the bellows.

FIGS. 27 and 28 show another embodiment of the tubular construction provided on the plate 3. In FIGS. 27 and 28, a plurality of plate-like fins 130 are provided on the plate 3. The fins 130 are discontinuously arranged along a circle and radially extend when viewed in section in FIG. 27. Since the fins 130 are spaced from one another preferably at an equidistance, the resistance against the flow of the coolant 2 can be decreased in comparison with the continuous cylindrical wall as shown in FIG. 24.

In FIG. 29 which shows a variant of the fins 130 shown in FIG. 28, the fins 140 have a streamline shape in section, from the viewpoint of aerodynamics, to decrease the resistance of the fins 140 to the smooth flow of the coolant 2.

FIG. 30 shows a cooling module according to another aspect of the present invention. In FIG. 30, the bellows 5 is directly connected to the first heat transfer plate 3, which has a larger diameter than that of the bellows. The peripheral end of the plate 3 is guided by guide rods 160 which will be described hereinafter.

Figure 31:
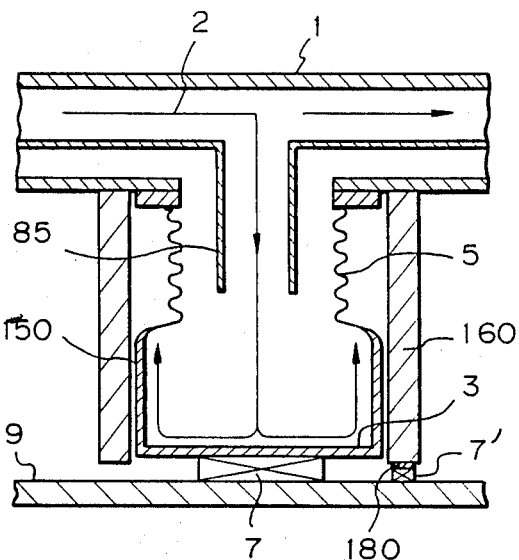
FIG. 31 is a sectional view showing a variant of FIG. 30.

FIG. 31 shows a different embodiment of FIG. 30. In FIG. 31, a cylindrical tubular plate 150 similar to the tubular plate 110 in FIG. 24 is connected to the bottom end of the bellows 5, which is smaller in diameter than the tubular plate 150. Namely, the plate 3 has a cylindrical tubular shape with an open end and a closed bottom to provide the tubular wall 150, which is defined by the side peripheral wall of the cylindrical plate 3. In the embodiment, since the tubular wall 150 has a larger surface area than that of the tubular wall 110 in FIG. 24, which can be understood when the diameters of the cylinders are taken into consideration, an increased heat transmission effect can be expected.

Figure 32:
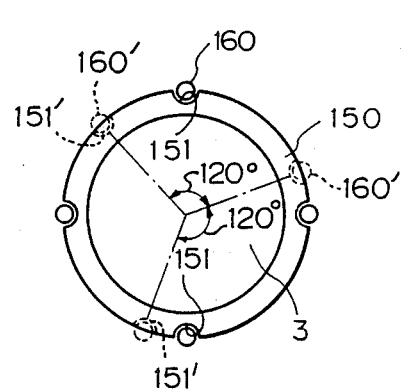
FIG. 32 is a schematic plan view of a tubular wall of a heat transfer plate and guide rods as shown in FIGS. 30 and 31.

In FIGS. 30 and 31, preferably guide rods 160 are provided around the plate 3 (FIG. 30) or the tubular wall 150 of the plate 3 (FIG. 31) to prevent the plate 3, and accordingly the wall 150, from being inclined with respect to the horizontal and thus the plane of the component 7, as can be seen in FIG. 32. The guide rods 160 extend vertically downward from the conduit 1 in recesses 151 provided on the tubular wall 150. The guide rods 160 also contribute to prevention of undesirable and accidental movement by the plate 3 during operation of the cooling modules. Furthermore, the guide rods 160 guide the downward movement of the plate 3 when it is located on the component 7.

Figure 33:
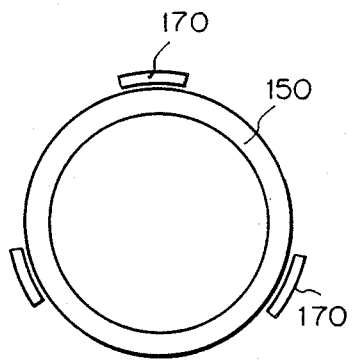
FIG. 33 is a view similar to FIG. 32, but showing a variant thereof.

The guide rods 160 can be replaced with guide plates 170 which have an arced section extending along the cylindrical wall 150, and which surround the cylindrical wall 150 as shown in FIG. 33. In this alternative, the recesses 151 shown in FIG. 31 can be omitted.

Because the diameters of the plate 3 or tubular wall 150 are larger than that of the bellows 5, the latter, which has usually a very small thickness, can be prevented from coming into undesirable contact or collision with the guide rods 160 or 170.

The number of the guide rods is not limited to four, and only three guide rods 160′ can be provided, as shown by imaginary lines in FIG. 32. For the three guide rods 160', three recesses 151' can be provided at a 120° spacing. More than four guide rods can be also provided.

It is possible to locate a small circuit component or components 7' different from the component 7 below the guide rod or rods 160, 160' and 170, so that the small component(s) 7' can be also cooled at one time, as shown in FIG. 31. A compound or compounds 180 having a high heat conductivity can be inserted between the lower end(s) of the guide rod(s) 160 and 170 and the corresponding component(s) 7'. The compound(s) 180 can serve as a spacer to adjust the distance between the lower end(s) of the guide rod(s) 160 and 170 and the component(s) 7'. In this alternative, the guide rod(s) 160 and 170 should be made of a material having a high heat conductivity, such as copper.

Figure 34:
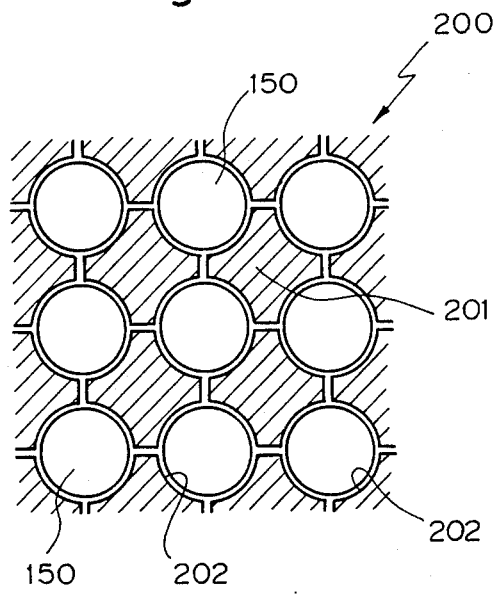
FIG. 34 is a view similar to FIG. 32 but showing still another variant thereof.

FIG. 34 shows a guide assembly 200 which entirely guides a series of tubular walls 150 of the cooling modules (also see FIGS. 14 and 17). The guide assembly 200 is constructed by blocks 201 each having a round cross shape in section and defining, together with adjacent blocks, openings 202 corresponding to the plates 3 or the tubular walls 150 thereof.

Figure 35:
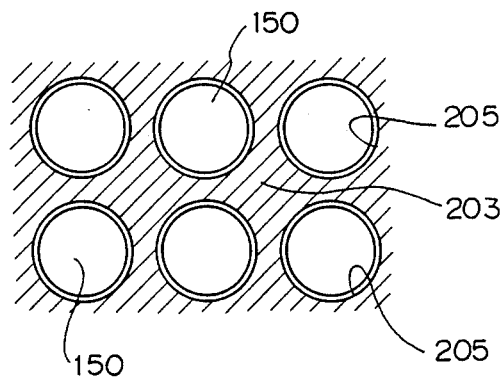
FIG. 35 is a view showing a modification of FIG. 34.

In FIG. 35, the separate blocks 201 of FIG. 23 are replaced by a single block 203 having a series of circular openings 205 corresponding to the diameter of the plates 3 or the tubular walls 150 thereof.

It is possible to provide a second solder 31 or a low-melting-point metal 96 between the plate 3 and the component 7 similar to the foregoing embodiments shown in FIGS. 24, 27, and 30.

According to still another aspect of the present invention, in order to increase the heat conductivity of the heat transfer plate 3, a means is provided for producing turbulence in the flow of the coolant 2, as shown in FIGS. 36 to 45.

Figure 36:
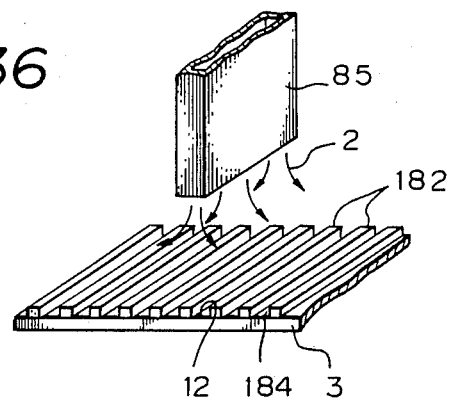
FIG. 36 is a schematic perspective view of the nozzle and ridges provided on the heat transfer plate, according to a different aspect of the present invention.
Figure 37:
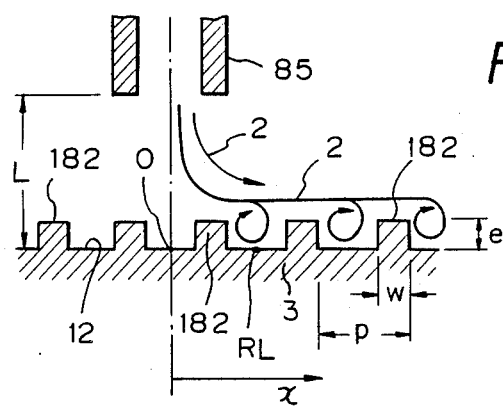
FIG. 37 is a cross sectional view of the plate of FIG. 36, for explaining how turbulence occurs in the coolant.

In an embodiment shown in FIGS. 36 and 37, the plate 3 is provided with a plurality of parallel ridges 182. When the nozzle 85 has a rectangular cross section, the ridges 182 extend in parallel to the length of the rectangle formed by the nozzles 85. When the coolant 2 is ejected from the nozzles 85 onto the plate 3, the coolant flowing on the upper surface 12 is disturbed by the ridges 182, so that turbulence of the coolant 2 occurs on the plate 3.

This turbulence causes a disturbance in the flow of the coolant 2 flowing along the heat transmission surface 12 therefrom, resulting in a production of vortexes in the flow of the coolant 2, as can be seen in FIG. 37. The vortexes locally increase the heat conductivity. The flow of the coolant 2 disturbed from the laminar flow and forming the vortexes, again comes into collision with the surface 12 at a point RL. The heat conductivity can be thus increased locally, particularly at the point RL, at which the flow comes into contact again with the plate 3.

Figure 38:
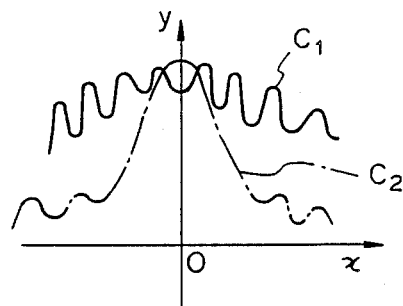
FIG. 38 is a diagram showing the relationship between the heat conductivity and the distance from the center point of the heat transfer plate directly below the nozzle, and comparing the effects caused by the presence or absence of ridges on the heat transfer plate.

With reference to FIG. 38, which shows a relationship between the heat conductivity y and the distance x from the point 0 directly below the nozzle opening of the nozzle 85 and on the surface 12 of the plate 3, the solid line C1 represents the present invention in which the ridges 182 are provided on the plate 3 and the dash-dot line C2 represents the prior art in which ridges are not provided on the plate 3 (flat surface plate), respectively. As can be seen from FIG. 38, the ridges 182 increase the heat conductivity even in the portion far from the center point 0. On the contrary, if there are no ridges on the plate, the heat conductivity is high only at or near to the center point 0. Namely, the ridges 182 provide a uniform distribution of the heat conductivity over the entire surface of the plate 3. The curve C1 varies in accordance with the distance L between the lower end of the nozzle 85 and the heat transmission surface 12 of the plate 3, the width w of one ridge 182, the height e of the ridges 182, and the pitch p of the ridges 182.

Figure 39:
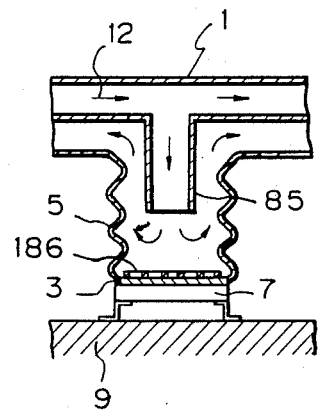
FIG. 39 is a cross sectional view of another embodiment of a cooling module different from the module of FIG. 36.
Figure 40:
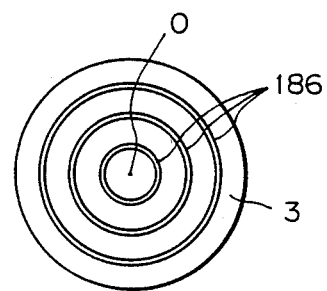
FIG. 40 is a plan view of a heat transfer plate having annular ridges.
Figure 41:
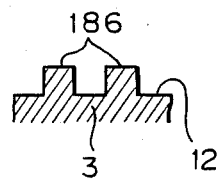
FIG. 41 is a cross sectional view of the ridges shown in FIG. 40.

FIGS. 39 to 41 show another embodiment of the invention, in which the plate 3 has a plurality of annular ridges 186 coaxial to each other on the heat transmission surface 12.

The ridges 186 have a rectangular cross section. The plate 3 is circular in plan view. The nozzle 85, which has a circular cross section, is located directly above the center of the innermost annular ridge 186. As will be understood from FIG. 38, the heat conductivity slightly decreases as the distance from the center point 0 of the surface 12 increases. Accordingly, if the ridges are annular as shown in FIG. 40, each ridge has the same distance x from the center point 0, and accordingly, a more uniform distribution of a higher heat conductivity can be expected from the arrangement shown in FIGS. 39 to 41. The ridges 186 also contribute to an increase of the area of the surface of the plate 3 in contact with the coolant 2, resulting in an increase of the cooling effect.

Figure 42:
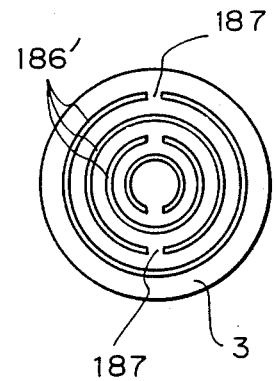
FIG. 42 is a plan view of a variant of the ridges of FIG. 40.

It should be noted that each ridge 186 need not always be a complete circle but can be discontinuous with a gap or gaps, as shown in FIG. 42.

In FIG. 42, each of the annular ridges 186 in FIG. 40 is replaced by a separate discontinuous annular ridge 186'. Namely, each annular ridge 186' has a small gap 187 to define a discontinuous annular ridge.

The gaps 187 are preferably deviated from each other for each ridge, in the circumferential direction.

Figure 43:
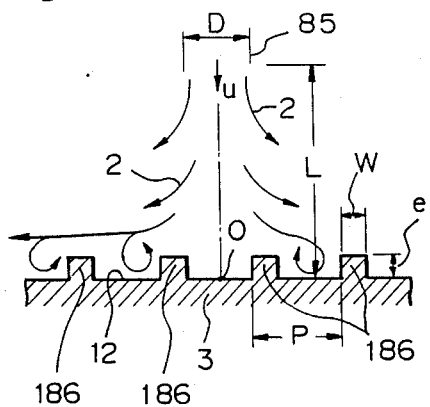
FIG. 43 is a cross sectional view for explaining how the turbulence of the coolant is caused by the ridges shown in FIG. 39.

In FIG. 43, the coolant 2 ejected from the nozzle 85 comes into collision with the center portion of the surface 12 of the plate 3 between the innermost ridges 186 (or 186') and spreads along the ridges 186 (or 186'). The same phenomena takes place at each of the ridges 186 (or 186') and the vortexes occur as shown in FIG. 43.

Figure 44:
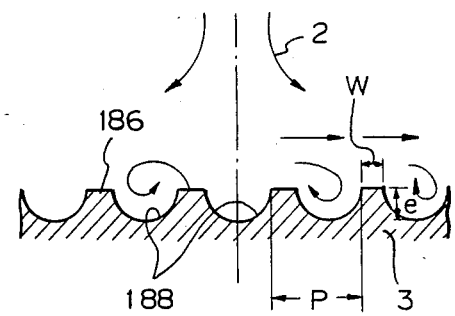
FIG. 44 is a view showing a modified heat transfer plate with annular ridges and round recesses therebetween.

It is also possible and preferable to provide round recesses 188 having a semicircular cross section between the annular ridges 186 (or 186'), as shown in FIG. 44. The round recesses 188 assist the production and the maintenance of the vortexes.

Figure 45:
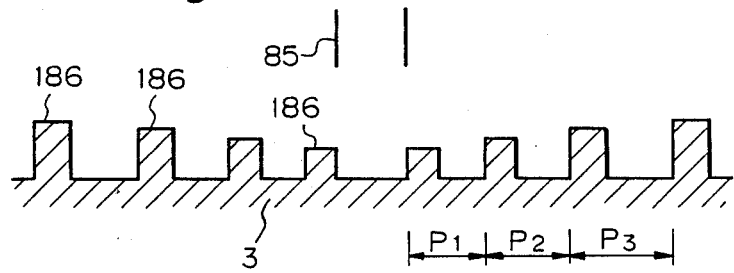
FIG. 45 is a sectional view of annular ridges having different pitches and heights.

FIG. 45 shows an alternative arrangement of the annular ridges 186 or 186', in which the ridges have different pitches and different heights. The pitches vary so that the pitch between the innermost ridge and the adjacent ridge is smallest and the pitch increases toward the outer ridges. Namely, in FIG. 45, $P_3 > P_2 > P_1$. The heights vary, so that the height of the innermost ridge is smallest and the height increases toward the outer ridges.

Figure 46:
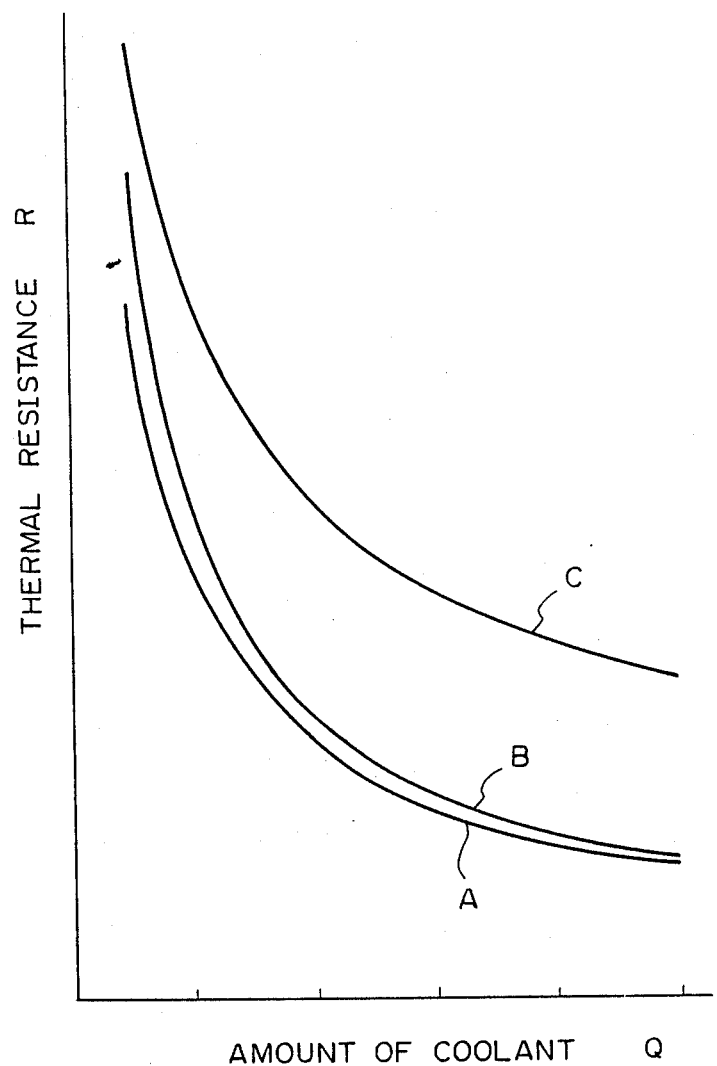
FIG. 46 is a diagram showing experimental results of the relationship between the thermal resistance and the amount of coolant, depending on the presence or absence of the ridges, and also depending on the presence or absence of the round recesses between the ridges.

FIG. 46 shows an experimental result of three products. The first product A is that shown in FIG. 44, which has the round recesses 188 between the annular ridges 186; the second product B is that shown in FIG. 43, which has the annular ridges 186 and the flat surface portions between the ridges; and, the third product C is that which has no ridges and which is the same as that used in the experiment shown in FIG. 38 and represented by the curve C2.

In the experiments, the diameter D of the nozzle 85, the width w of the ridge 186, the height e of the ridge 186, and the pitch p of the ridges 186 had the following relationship:

w/D=0.1:e/w=1:p/e=5 (for product A).

The product B had the width w, the pitch p, and the diameter D same as those of the product A.

In FIG. 46, the axis of the ordinates designated by R represents the thermal resistance between the coolant 2 and the heat transmission surface 12 of the plate 3, and the axis of the abscissas designated by Q represents the amount of the coolant 2. It will be understood that the thermal resistance R can be decreased by about one half by the provision of the ridges 186, when the amount of coolant is relatively large.

It will be also understood that the round recesses 188 contribute to a decrease of the thermal resistance R.

The experimental results shown in FIG. 46 were obtained using apparatus wherein the ratio L/D is equal to or less than about 6 to 8. The optimum values of w, e and p depend on the values assigned to L and D. Thus, in one preferable example, with reference to FIG. 43, the ratio e/D may range from about 1/20 to about ⅓, the ratio p/e may range from about 3 to about 10 and the ratio w/e may be equal to unity. In another embodiment, for example, as illustrated in FIG. 44, the ratio p/D may range from about 0.2 to about 2 and the ratio w/d may range from about 1/20 to about ⅓. In apparatuses wherein the ratio L/D is equal to or less than about 6 to 8, the Reynolds number ($N_{Re}$), which is equal to the relationship $uD/\gamma$ (wherein u represents the velocity of the coolant ejected from nozzle 85 and $\gamma$ represents the coefficient of kinematic viscosity), may range from 1000 to several tens of thousands.

It is possible to design an arrangement having the relationship between P, D, e in such a way that e/D and/or P/D increases from the innermost ridge toward the outer ridges.

The cooling apparatus can be used upside down, so that the coolant is ejected upward from the nozzles 85 toward the heat transfer plates 3 located above the nozzles 85.

As can be seen from the above mentioned description, according to the present invention, the allowable heat transfer between the first heat transfer plate and the circuit component or the second heat transfer plate, if any, can be increased and the thermal contact resistance therebetween can be decreased, resulting in a high heat transfer ratio and a high cooling efficiency.

Furthermore, according to the present invention, the first heat transfer plates can be easily disconnected from the circuit components or the second heat transfer plates, if any, merely by melting the second solder or by solidifying the low-melting-point metal, between the first heat transfer plates and the circuit components or the second heat transfer plates. In addition, according to the present invention, the second solder or the low-melting-point metal can be maintained between the two heat transfer plates or the transfer plates and the circuit components without leaking out from therebetween.

We claim:

1. In an electronic circuit device comprising a printed circuit board supporting thereon at least one electronic circuit component connected thereto by first solder means, a cooling system for the component including a cooling module which comprises a conduit for coolant flow, a first heat transfer plate directly exposed to the flow of the coolant for transferring the heat dissipated from the circuit component to the coolant, second solder means between the heat transfer plate and the circuit component for establishing a compliant contact between the first heat transfer plate and the circuit component through the second solder means, and elastic means connected to the first heat transfer plate for resiliently biasing the first heat transfer plate toward the circuit component, said second solder means having a melting point which is lower than that of the first solder means so as to ensure that the second solder means melts at a temperature where the first solder means remains solid.

2. A cooling system according to claim 1, wherein said cooling module further comprises a second heat transfer plate which is provided on the circuit component and which is thermally connected to the first heat transfer plate through the second solder means.

3. A cooling system according to claim 1, wherein said cooling module further comprises means interposed between the first heat transfer plate and the circuit component for maintaining a constant amount of the second solder means therebetween when the first heat transfer plate is pressed against the circuit component by the elastic means.

4. A cooling system according to claim 3, wherein said maintaining means comprises projection means on the first heat transfer plate disposed to come into contact with the circuit component when the first heat transfer plate is pressed against the circuit component.

5. A cooling system according to claim 3, wherein said maintaining means comprises projection means on the circuit component disposed to come into contact with the first heat transfer plate when the first heat transfer plate is pressed against the circuit component.

6. A cooling system according to claim 4, wherein said projection means comprises three protrusions each having an end which defines a flat contacting face.

7. A cooling system according to claim 4, wherein said projection means defines a semispherically curved contacting surface on the first heat transfer plate.

8. A cooling system according to claim 5, wherein said projection means defines a semispherically curved contacting surface on the circuit component.

9. A cooling system according to claim 1, wherein said cooling module further comprises means disposed between the first heat transfer plate and the circuit component, for discharging air bubbles which otherwise would remain in the second solder means without being discharged.

10. A cooling system according to claim 9, wherein said air bubbles discharging means comprises at least one recessed passage through which the air bubbles can be discharged, provided on the first heat transfer plate.

11. A cooling system according to claim 9, wherein said air bubbles discharging means comprises at least one recessed passage through which the air bubbles can be discharged, provided on the circuit component.

12. A cooling system according to claim 10, wherein said recessed passage comprises a plurality of radially extending recessed grooves.

13. A cooling system according to claim 10, wherein said recessed passage comprises a plurality of grid-like recessed grooves.

14. A cooling system according to claim 12, wherein said recessed grooves are V-shaped.

15. A cooling system according to claim 13, wherein said recessed grooves are V-shaped.

16. A cooling system according to claim 12, wherein said recessed grooves are trapezoid in section.

17. A cooling system according to claim 13, wherein said recessed grooves are trapezoid in section.

18. A cooling system according to claim 10, wherein said recessed passage is formed from patterned solder resist.

19. A cooling system according to claim 1, wherein said cooling module further comprises means disposed between the first heat transfer plate and the circuit component for preventing the second solder means from leaking out from therebetween.

20. A cooling system according to claim 19, wherein said preventing means comprises a circumferential wall provided on the first heat transfer plate to surround the second solder means.

21. A cooling system according to claim 19, wherein said preventing means comprises a circumferential wall provided on the circuit component to surround the second solder means.

22. A cooling system according to claim 20, wherein said circumferential wall is made of a solder resist.

23. A cooling system according to claim 19, wherein said preventing means comprises a circumferential wall provided on either the first heat transfer plate or on the circuit component, and a projection means provided on the other one of the first heat transfer plate and the circuit component.

24. A cooling system according to claim 23, wherein said projection means comprises three protrusions each having an end which defines a flat contacting face, said protrusions having a height larger than the height of the circumferential wall.

25. A cooling system according to claim 23, wherein said projection means comprises a trapezoidal protrusion which has a height smaller than the height of the circumferential wall.

26. A cooling system according to claim 1, wherein said cooling module further comprises means for directing a flow of high temperature fluid into said conduit when the second solder means is to be melted.

27. A cooling system according to claim 1, wherein said cooling module further comprises heating means provided in the first heat transfer plate for heating the second solder means.

28. A cooling system according to claim 27, wherein said heating means comprises an electrical heater installed in the first heat transfer plate.

29. A cooling system according to claim 28, wherein said heating means comprises a separate heater unit having an electrical heater which can be brought into contact with the first heat transfer plate to melt the second solder means, said heater unit being detachably attached to the cooling module.

30. A cooling system according to claim 29, wherein said conduct comprises a detachable cover which defines a passage in which the coolant flows, and wherein said separate heater unit is detachably inserted into the conduit after the removal of the detachable cover.

31. A cooling system according to claim 29, wherein said heater unit comprises elastic means for resiliently biasing the heater against the first heat transfer plate.

32. A cooling system according to claim 5, wherein said projection means comprises three protrusions each having an end which defines a flat contacting face.

33. A cooling system according to claim 11, wherein said recessed passage comprises a plurality of radially extending recessed grooves.

34. A cooling system according to claim 11, wherein said recessed passage comprises a plurality of grid-like recessed grooves.

35. A cooling system according to claim 11, wherein said recessed passage is formed from patterned solder resist.

36. A cooling system according to claim 21, wherein said circumferential wall is made of a solder resist.

* * * * *

UNITED STATES PATENT AND TRADEMARK OFFICE
CERTIFICATE OF CORRECTION

PATENT NO.  : 4,879,632                                        Page 1 of 2
DATED       : November 7, 1989
INVENTOR(S) : HARUHIKO YAMAMOTO et al.

It is certified that error appears in the above-identified patent and that said Letters Patent is hereby corrected as shown below:

```
FRONT PAGE - [30] Foreign Application Priority Data
          "60-259384" should be --60-259284--.
Column 1,   line 34, after "as" insert --a--.
Column 2,   lines 28 and 29, delete "means for producing".
Column 7,   line 48, after "38" insert --or 40--.
Column 8,   line 32, "slder" should be --solder--.
Column 10,  line 14, after "for" insert --the--;
            line 38, "firs" should be --first--;
            line 39, "show" should be --shown--.
Column 11,  lines 28 and 29, "40°C to about" should be
                   --40°C ---;
Column 12,  line 37, "leading" should be --leaking--;
            line 54, "ste" should be --state--.
Column 13,  line 64, "FIGS." should be "FIG.".
Column 15,  line 58, "y" should be --y--; "x" should be --x--.
Column 16,  line 4,  "L" should be --L--;
            line 6,  "w" should be --w--;
            line 7,  "e" should be --e--, "p" should be --p--;
            line 21, "x" should be --x--;
            line 65, "D" should be --D--;
            line 66, "w" should be --w--, "e" should be --e--;
            line 67, "p" should be --p--.
Column 17,  line 4,  "w" should be --w--, "p" should be --p--;
            line 5,  "D" should be --D--;
            line 67, after "the" insert --first--.
Column 18,  line 37, "semispherically" should be
                   --semi-spherically--;
```

UNITED STATES PATENT AND TRADEMARK OFFICE
CERTIFICATE OF CORRECTION

PATENT NO. : 4,879,632

DATED : November 7, 1989

INVENTOR(S) : HARUHIKO YAMAMOTO et al.

It is certified that error appears in the above-identified patent and that said Letters Patent is hereby corrected as shown below:

Column 18, line 40, "semispherically" should be --semi-spherically--.

Signed and Sealed this

Sixth Day of August, 1991

Attest:

HARRY F. MANBECK, JR.

Attesting Officer

Commissioner of Patents and Trademarks